(12) United States Patent
Dahmani

(10) Patent No.: US 8,268,664 B2
(45) Date of Patent: Sep. 18, 2012

(54) METHODS OF MANUFACTURING A SEMICONDUCTOR DEVICE; METHOD OF MANUFACTURING A MEMORY CELL; SEMICONDUCTOR DEVICE; SEMICONDUCTOR PROCESSING DEVICE; INTEGRATED CIRCUIT HAVING A MEMORY CELL

(75) Inventor: Faiz Dahmani, Alfortville (FR)

(73) Assignees: Altis Semiconductor, Corbeil Essonnes Cedex (FR); Adesto Technology Corporation, Sunnyvale, CA (US)

(*) Notice: Subject to any disclaimer, the term of this patent is extended or adjusted under 35 U.S.C. 154(b) by 646 days.

(21) Appl. No.: 11/714,091

(22) Filed: Mar. 5, 2007

(65) Prior Publication Data

US 2008/0217670 A1 Sep. 11, 2008

(51) Int. Cl.
*H01L 21/00* (2006.01)

(52) U.S. Cl. ............ 438/95; 438/102; 438/84; 438/104; 438/513; 438/798; 257/E21.07

(58) Field of Classification Search .................. 438/95
See application file for complete search history.

(56) References Cited

U.S. PATENT DOCUMENTS

| | | | |
|---|---|---|---|
| 6,660,176 B2 | 12/2003 | Tepper et al. | |
| 6,730,547 B2 | 5/2004 | Li et al. | |
| 6,734,455 B2 | 5/2004 | Li | |
| 6,878,569 B2 | 4/2005 | Li | |
| 6,890,790 B2 * | 5/2005 | Li et al. | 438/93 |
| 7,442,754 B2 | 10/2008 | Tepper et al. | |
| 2001/0001503 A1 * | 5/2001 | Guo et al. | 257/622 |
| 2002/0102312 A1 | 8/2002 | Tepper et al. | |
| 2003/0068862 A1 * | 4/2003 | Li et al. | 438/257 |
| 2003/0146452 A1 * | 8/2003 | Chiang | 257/200 |
| 2004/0042265 A1 * | 3/2004 | Moore et al. | 365/163 |
| 2004/0144968 A1 | 7/2004 | Li | |
| 2005/0026433 A1 | 2/2005 | Li et al. | |
| 2006/0011910 A1 * | 1/2006 | Campbell | 257/42 |
| 2007/0295597 A1 | 12/2007 | Ufert | |
| 2008/0242820 A1 | 10/2008 | Tepper et al. | |

FOREIGN PATENT DOCUMENTS

| | | |
|---|---|---|
| DE | 102 56 909 B3 | 7/2004 |
| DE | 10 2006 028 977 A1 | 12/2007 |
| JP | 61-118137 | 6/1986 |
| WO | WO 2004/051734 A1 | 6/2004 |

* cited by examiner

*Primary Examiner* — Ajay K Arora

(74) *Attorney, Agent, or Firm* — Slater & Matsil, L.L.P.

(57) ABSTRACT

Methods of manufacturing a semiconductor device, a method of manufacturing a memory cell, a semiconductor device, a semiconductor processing device, and a memory cell, are provided. In one embodiment a method of manufacturing a semiconductor device is provided including forming a metal doped chalcogenide layer using light irradiation at least partially during provision of the metal.

44 Claims, 5 Drawing Sheets

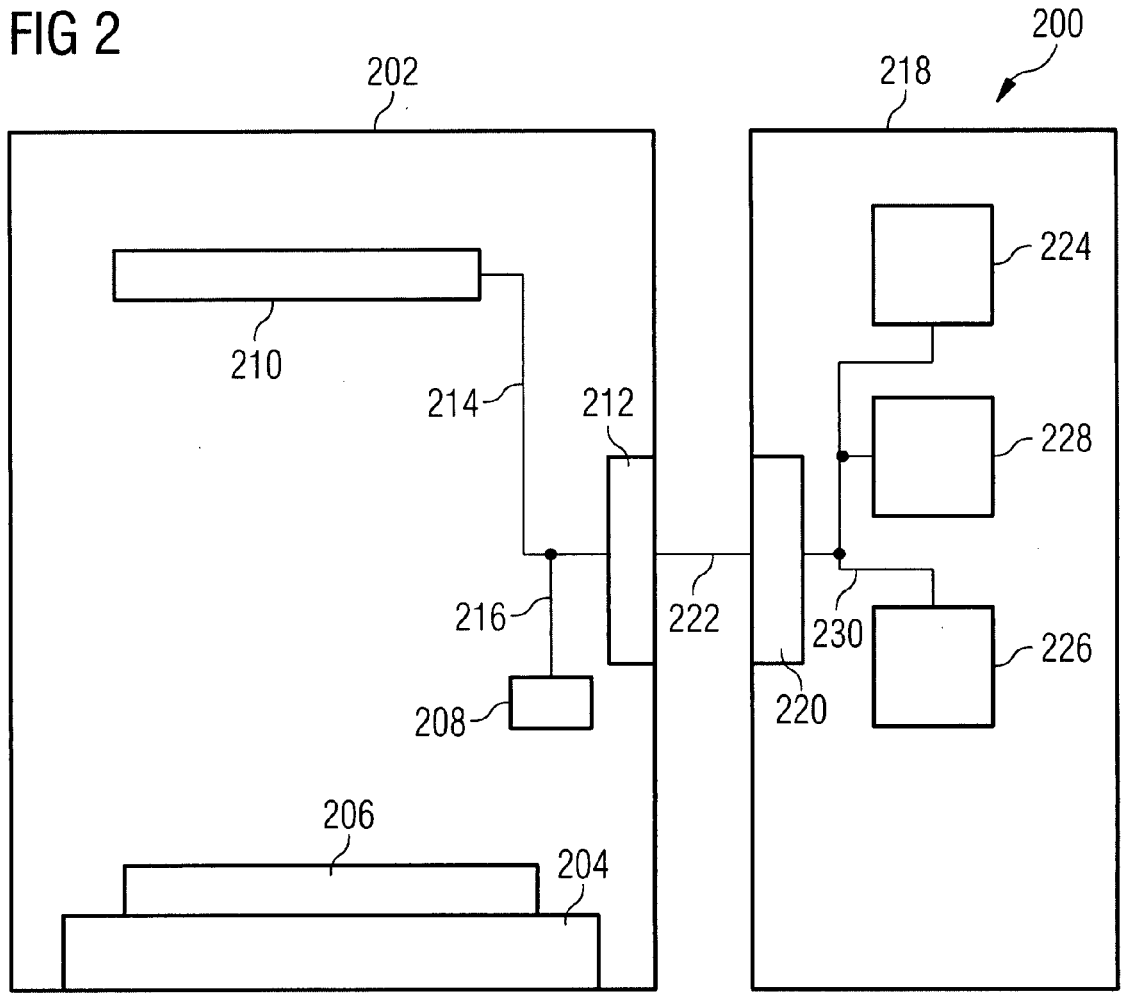
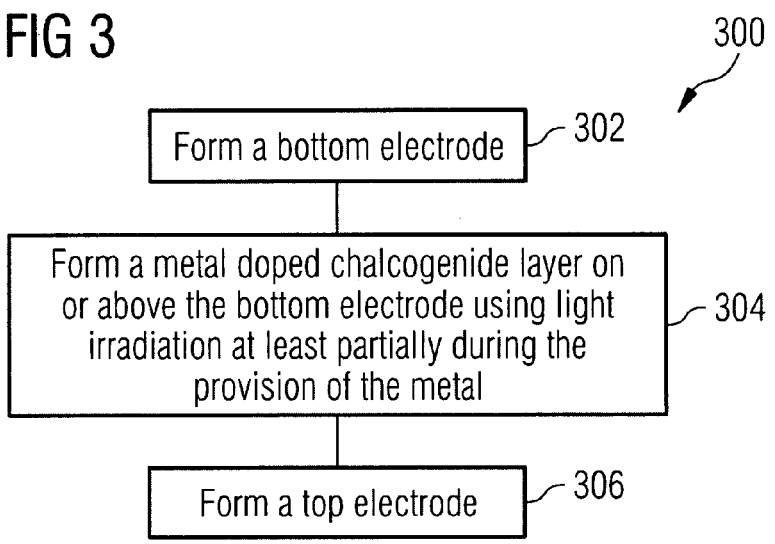

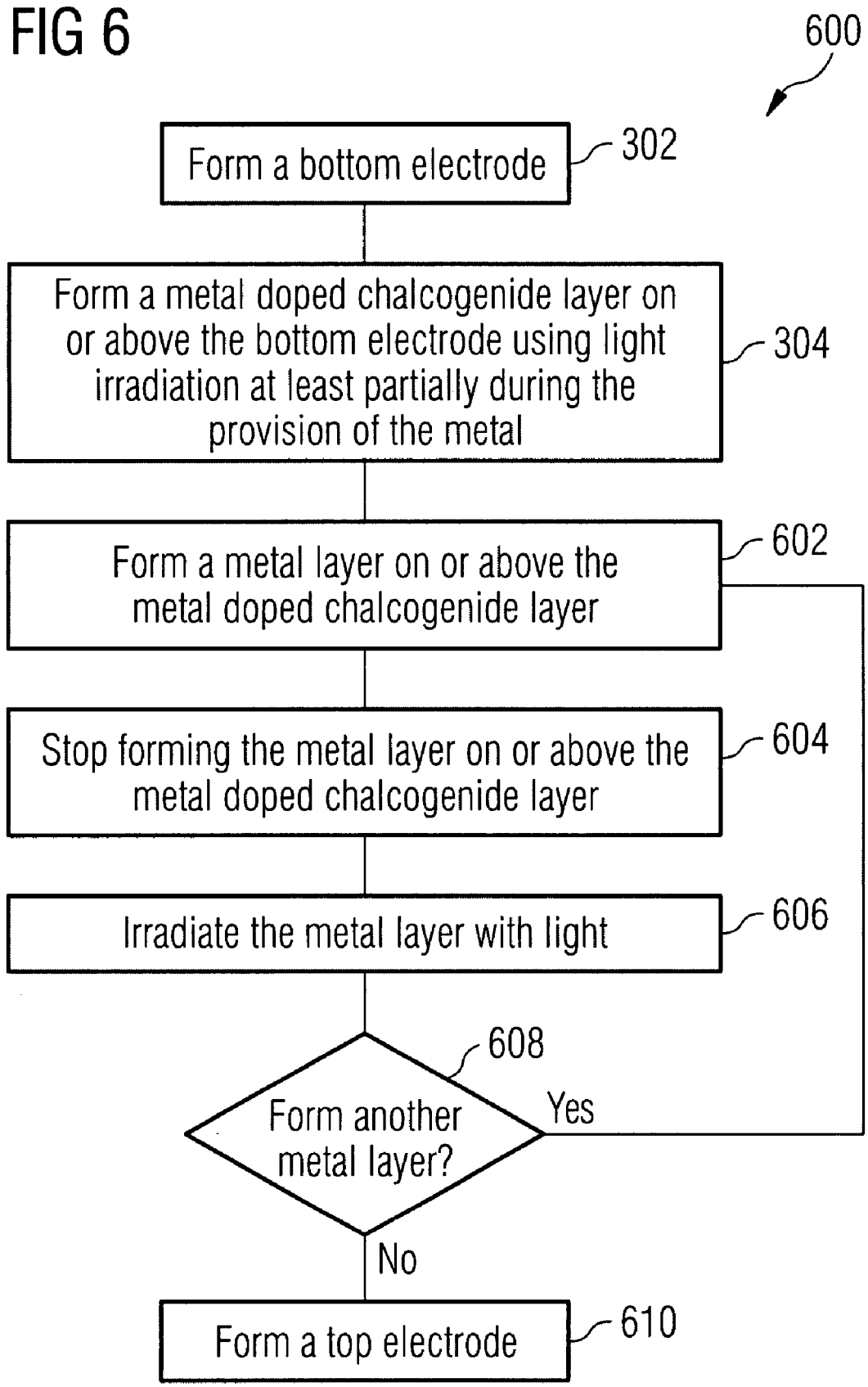

METHODS OF MANUFACTURING A SEMICONDUCTOR DEVICE; METHOD OF MANUFACTURING A MEMORY CELL; SEMICONDUCTOR DEVICE; SEMICONDUCTOR PROCESSING DEVICE; INTEGRATED CIRCUIT HAVING A MEMORY CELL

BACKGROUND

The present invention relates to methods of manufacturing a semiconductor device, methods of manufacturing a memory cell, semiconductor devices, semiconductor processing device, and integrated circuits having a memory cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a semiconductor processing device in accordance with an exemplary embodiment of the invention;

FIG. 3 shows a flow diagram illustrating a method of manufacturing a memory cell in accordance with an exemplary embodiment of the invention;

FIG. 6 shows a flow diagram illustrating a method of manufacturing a memory cell in accordance with another exemplary embodiment of the invention.

DETAILED DESCRIPTION OF ILLUSTRATIVE EMBODIMENTS

Doping a chalcogenide layer with a metal such as silver is conventionally carried out by depositing the metal layer on a previously formed chalcogenide layer. The doping metal is then diffused into the chalcogenide layer.

The diffusion process may conventionally be carried out using different principles:

a) Thermally-Induced Diffusion:

This process requires high annealing temperatures, which could lead to a possible degradation of the structure, then to a decrease in the yield performance. Another effect of this process is moving the wafer from tool to tool, which can generate physical damage and particle contamination.

b) Optically-Induced Diffusion:

Atmosphere ultraviolet light photo-dissolution after metal deposition on chalcogenide layer. This process is performed in atmosphere after the vacuum deposition, which leads to a risk of oxidation causing a degradation of the effect of ultraviolet exposure.

In-situ ultraviolet light exposure after a metal deposition. Although this process looks more reliable than the previous ones, the effect of this process is that the metal layer is already formed and the photo-diffusion performance could be limited.

c) Plasma-Induced Diffusion Using a Helium or Neon Gas During Metal Sputtering:

This process is limited by the intensity of ultraviolet light emitted from the plasma.

Since embodiments of the present invention can be applied to solid electrolyte devices like CBRAM (conductive bridging random access memory, also referred to as programmable metallization cell, PMC) devices, in the following description, making reference to FIG. 1A and FIG. 1B, a basic principle underlying a CBRAM device in accordance with an embodiment of the invention will be explained. Embodiments of the present invention can also be applied to other types of resistive memory devices like PCRAM (phase changing random access memory) devices. Alternative embodiments of the invention may be applied to other chalcogenide structures independent on whether the structure is a memory cell structure or not.

Figures 1A, 1B:
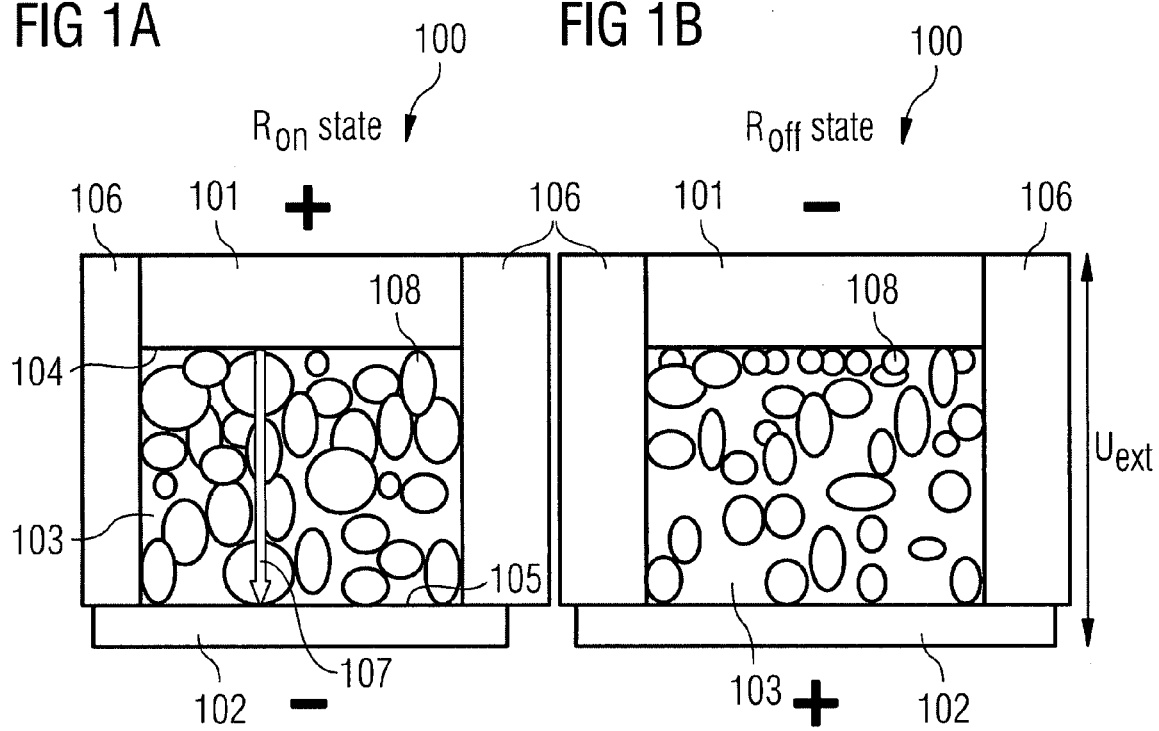
FIGS. 1A and 1B show a schematic cross-sectional view of a solid electrolyte memory device set to a first switching state (FIG. 1A) and a schematic cross-sectional view of a solid electrolyte memory device set to a second switching state (FIG. 1B)

As shown in FIG. 1A, a CBRAM cell 100 includes a first electrode 101 a second electrode 102, and a solid electrolyte block (in the following also referred to as ion conductor block) 103, which is the active material and, which is sandwiched between the first electrode 101 and the second electrode 102. The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 is the bottom electrode of the CBRAM cell. One electrode of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, and the isolation structure 106 includes silicon dioxide ($SiO_2$).

If a voltage as indicated in FIG. 1A is applied across the ion conductor block 103, a redox reaction is initiated that drives $Ag^+$ ions out of the first electrode 101 into the ion conductor block 103 where they are reduced to Ag, thereby forming Ag rich clusters within the ion conductor block 103. If the voltage applied across the ion conductor block 103 is applied for a long period of time, the size and the number of Ag rich clusters within the ion conductor block 103 is increased to such an extent that a conductive bridge 107 between the first electrode 101 and the second electrode 102 is formed. In case that a voltage is applied across the ion conductor block 103 as shown in FIG. 1B (inverse voltage compared to the voltage applied in FIG. 1A), a redox reaction is initiated that drives $Ag^+$ ions out of the ion conductor block 103 into the first electrode 101 where they are reduced to Ag. As a consequence, the size and the number of Ag rich clusters within the ion conductor block 103 is reduced, thereby erasing the conductive bridge 107.

In order to determine the current memory status of the CBRAM cell 100, for example, a sensing current is routed through the CBRAM cell 100. The sensing current experiences a high resistance in case no conductive bridge 107 exists within the CBRAM cell 100, and experiences a low resistance in case a conductive bridge 107 exists within the CBRAM cell 100. A high resistance may, for example, represent logic "0", whereas a low resistance represents logic "1", or vice versa. The memory status detection may also be carried out using sensing voltages, as described in the present invention.

In one embodiment of the invention, the ion conductor block 103 may be made of a chalcogenide material. In the context of this description, chalcogenide material is to be understood, for example, as any compound containing Sulfur (S), Selenium (Se), Germanium (Ge) and/or Tellurium (Te). In accordance with one embodiment of the invention, the ion conducting material is, for example, a compound, which is made of a chalcogenide and at least one metal of group I or group II of the periodic system, for example, Arsene-triSulfide-Silver ($AsS_3Ag$). Alternatively, the chalcogenide material contains Germanium-Sulfide (GeS), Germanium-diSulfide ($GeS_2$), Germanium-Selenide (GeSe), Tungsten Oxide ($WO_x$), Copper Sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, Copper (Cu) and Zinc (Zn) or of a combination or an alloy of these metals.

FIG. 2 shows a semiconductor processing device 200. The semiconductor processing device 200 has a deposition process chamber 202, e.g., a vapor deposition process chamber 202. In one embodiment of the invention, the vapor deposition process chamber 202 may be a chemical vapor deposition (CVD) process chamber 202. In another embodiment of the invention, the vapor deposition process chamber 202 may be a physical vapor deposition (PVD) process chamber 202, e.g., a sputter deposition process chamber 202. In one embodiment of the invention, as will be described in more detail below, the sputter deposition process chamber 202 may be a co-sputter deposition process chamber 202.

The deposition process chamber 202 has a carrying member 204 carrying a semiconductor device 206 to be processed. In one embodiment of the invention, the carrying member 204 may be a wafer chuck, e.g., an electrostatic wafer chuck. However, any other suitable carrying member 204 to carry or hold the semiconductor device 206 to be processed may be provided in an alternative embodiment of the invention. In one embodiment of the invention, the semiconductor device 206 to be processed may be a semiconductor wafer, e.g., a silicon wafer, of any suitable size. However, any other suitable material may be used for the wafer such as a wafer made of an isolating material such as silicon oxide. However, any other suitable material may be used for the wafer in an alternative embodiment of the invention.

The deposition process chamber 202 furthermore includes one or a plurality of gas inlets 208, via which the process gases, e.g., precursor gases are introduced into the reaction region of the deposition process chamber 202. One or a plurality of gas sources may be coupled to the one or plurality of gas inlets 208 to provide the gas(es) used for the respective deposition process(es). In case the deposition process chamber 202 is a sputter deposition process chamber 202, a sputter target or a plurality of sputter targets (not shown) is/are also provided in the sputter deposition process chamber 202. In case the deposition process chamber 202 is a co-sputter deposition process chamber 202, a co-sputter target or a plurality of co-sputter targets (not shown) is/are also provided in the sputter deposition process chamber 202.

Furthermore, a light source 210 (or a plurality of light sources 210) is provided in the deposition process chamber 202. The light source 210 may be arranged such that it irradiates at least a portion of the upper surface, in one embodiment of the invention, the entire surface, of the semiconductor device 206 to be processed. In one embodiment of the invention, the light source 210 provides light having a wavelength of about 400 nm at maximum, e.g., light having a wavelength of about 380 nm at maximum, e.g., light having a wavelength of about 200 nm at maximum. In one embodiment of the invention, the light source 210 provides ultraviolet light (e.g., in the range of about 1 nm to about 380 nm), e.g., weak ultraviolet light (e.g., light having a wavelength in the range of about 200 nm to about 380 nm). In another embodiment of the invention, the light source 210 provides strong ultraviolet light (e.g., light having a wavelength in the range of about 50 nm to about 200 nm). In yet another embodiment of the invention, the light source 210 provides deep ultraviolet light (e.g., light having a wavelength in the range of about 1 nm to about 50 nm).

The deposition process chamber 202 further includes a control input/output interface 212, which is coupled to the one or plurality of gas inlets 208 (e.g., via a first connection 214, e.g., a first cable 214) and to the light source 210 (e.g., via a second connection 216, e.g., a second cable 216). In another embodiment of the invention, separate and independent input/output interfaces may be provided, e.g., a first input/output interface being coupled to the one or plurality of gas inlets 208 to control the gas flow into the deposition process chamber 202, and a second input/output interface being coupled to the light source 210 to control the timing and optionally the intensity and optionally the wavelength of the light (e.g., ultraviolet light) being irradiated onto the surface of the semiconductor device 206 to be processed. The control input/output interface 212 provides a connection to a controller device 218, which will be described in more detail below.

It should be mentioned that the control input/output interface 212 may be a unidirectional interface, via which control signals may only be provided from the controller device 218. However, in an alternative embodiment of the invention, the control input/output interface 212 may be a bidirectional interface providing a bidirectional signal flow between the respectively controlled device (such as, e.g., the one or plurality of gas inlets 208 or the one or plurality of light sources 210) and the controller device 218. In one embodiment of the invention, the controlled device(s) may thus provide sensor signals or status signals to the controller device 218, which then could take those signals into account during the control of the processes, which will be described in more detail below.

In one embodiment of the invention, the deposition process chamber 202 may include additional components, which will not be described herein for clarity reasons.

As briefly described above, the semiconductor processing device 200 furthermore includes the controller device 218. The controller device 218 includes a controller input/output interface 220 (unidirectional or bidirectional). In one embodiment of the invention, the controller input/output interface 220 is connected to the control input/output interface 212 via a control connection 222, e.g., via a control cable 222 or a wireless connection 222.

The controller device 218 further includes one or a plurality of memories, e.g., a read only memory (ROM) 224, which may be an erasable programmable read only memory (EPROM), an electrically erasable programmable read only memory (EEPROM), e.g., a non-volatile random access memory such as a Flash memory. In one embodiment of the invention, a computer program code is stored in the ROM 224, which is configured to control the components of the deposition process chamber 202 in order to execute the provided processes. In one embodiment of the invention, the controller device 218 further includes a random access memory (RAM) 226, e.g., a volatile RAM or a non-volatile RAM, storing data used, e.g., during the execution of the respective process(es). In one embodiment of the invention, the controller device 218 further includes a controller 228. The controller 228 may be a programmable processor, e.g., a microprocessor. However, the controller 228 may be a hard-wired control logic in an alternative embodiment of the invention. The controller 228, the RAM 226 and the ROM 224 and the controller input/output interface 220 are connected with each other via a (unidirectional or bidirectional) controller connection 230 such as, e.g., a controller bus 230.

As will be described in more detail below, the controller 228 executes control computer program code (which may be stored in the ROM 224), and generates control signals (which may be inserted into control messages) and transmits the control signals (possibly within control messages) to the respectively controlled component of the deposition process chamber 202, thereby, e.g., controlling the light source 210 and the deposition process. As will be described in more detail below, in one embodiment of the invention, the light source 210 and the deposition process are controlled such that light irradiation is provided at least partially during a deposition process during one or a plurality of processes of manufacturing a semiconductor device.

Referring now to a flow diagram 300 in FIG. 3, a method of manufacturing a memory cell in accordance with an exemplary embodiment of the invention will be described in more detail. However, it should be mentioned that in another embodiment of the invention, any other device may be manufactured instead of a memory cell.

As shown in FIG. 3, at 302, a first electrode (also referred to as a bottom electrode in the following) is formed on or above a conductive region in the substrate assembly. In one particular embodiment of the invention, a wafer (e.g. wafer 206) such as a wafer described above, is placed into the deposition process chamber 202 onto the carrying member 204.

At 304, a metal doped chalcogenide layer is formed on or above the bottom electrode using light irradiation at least partially during the provision of a metal to form an active layer. In one embodiment of the invention, the metal is selected from the group of metals consisting of pure Silver (Ag), Silver-Tantalum (AgTa), Silver-Copper (AgCu), Silver-Aluminum (AgAl), Silver-Molybdenum (AgMo), Silver-Ruthenium (AgRu), Silver-Magnesium (AgMg), or any silver alloy compound composed of at least two elements with Silver (Ag) concentration being the highest. In one embodiment of the invention, the metal layer has a thickness in the range of about 20 nanometers (nm) to about 60 nanometers (nm). In one embodiment of the invention, the metal layer has a thickness in the range of about 10 nanometers (nm) to 40 nanometers (nm). In one embodiment of the invention, the light (e.g., ultraviolet light or light having a wavelength in one of the above-described ranges) is illuminated onto the upper surface of the wafer (e.g., 206) during a deposition process within the process of forming the metal doped chalcogenide layer. In an embodiment of the invention, the metal or the chalcogenide and the metal are provided at the same time (e.g., by means of co-sputtering).

Figure 4A:
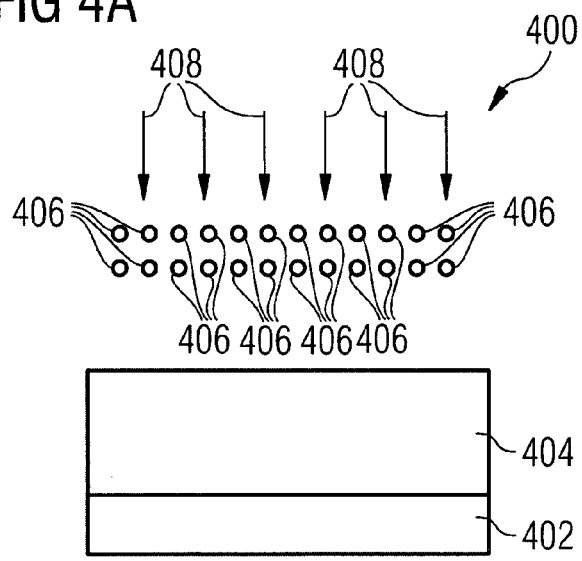
FIGS. 4A to 4C show the manufacturing of a memory cell in accordance with an exemplary embodiment of the invention at different stages of manufacturing.
Figure 4B:
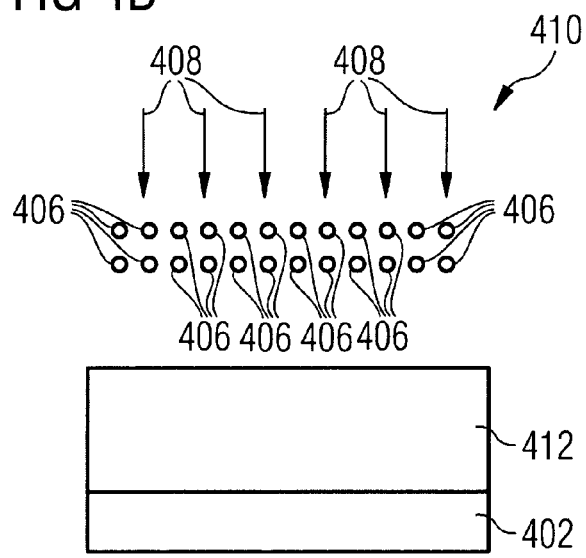
Figure 4C:
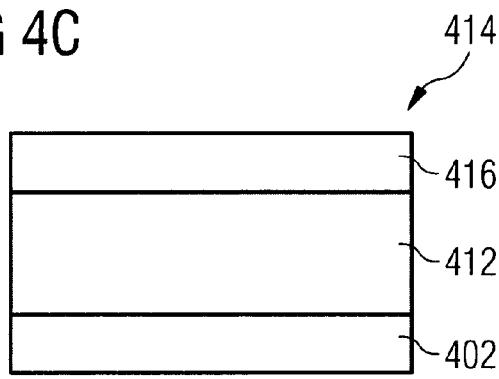

As shown in FIG. 4A to FIG. 4C, in one embodiment of the invention, first, a chalcogenide layer 404 (made of any of the above-described materials) is deposited on or above the upper surface of the previously-formed bottom electrode 402 (see structure 400 in FIG. 4A). Next, the chalcogenide layer 404 is doped with metal particles 406 using, e.g., a sputter process (symbolized in FIG. 4A by means of arrows 408) within the deposition process chamber 202, which in accordance with this embodiment of the invention, is a sputter process chamber 202. In this embodiment of the invention, the light source 210 is controlled in such a way that the light is illuminated on the upper surface of the chalcogenide layer 404 during the sputtering of the metal.

In a particular embodiment of the invention, process parameters are as follows:

gases: Argon (Ar), Helium (He), Neon (Ne), Argon-Helium (Ar—He), Argon-Neon (Ar—Ne), Krypton (Kr), Argon-Krypton (Ar—Kr), flow: 10 Standard Cubic Centimeters per Minute (sccm)-50 Standard Cubic Centimeters per Minute (sccm), pressure: 0.05 milliTorr (mT)-10 milliTorr (mT), process power: 30 Watts (W)-500 Watts (W), wavelength of the light: 200 nanometers (nm)-400 nanometers (nm), light intensity: 1 milliwatts per square centimeter (mW/cm$^2$)-100 milliwatts per square centimeter (mW/cm$^2$), layer thicknesses: 5 nanometers (nm)-400 nanometers (nm), deposition time duration: 20 seconds (sec)-800 seconds (sec).

In one particular embodiment of the invention, the metal used for doping the chalcogenide layer 404 is a metal of a group of metals consisting of silver, copper, and an alloy of silver with another metal. The result of the sputter process is shown in structure 410 in FIG. 4B including a metal doped chalcogenide layer 412.

Figure 5A:
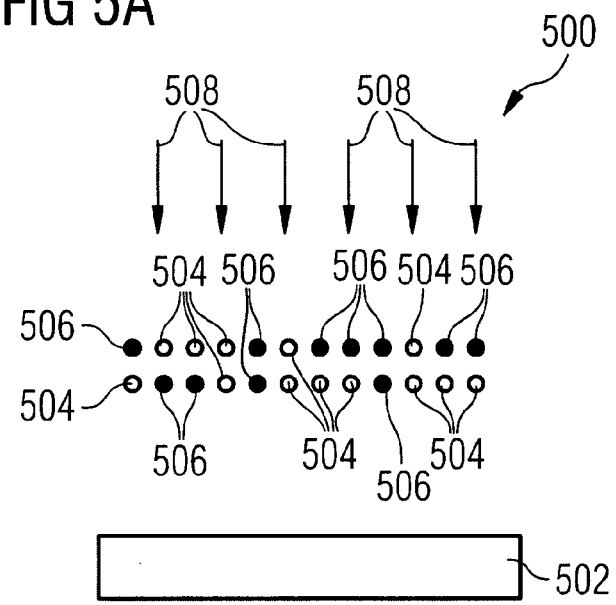
FIGS. 5A to 5C show the manufacturing of a memory cell in accordance with another exemplary embodiment of the invention at different stages of manufacturing.
Figure 5B:
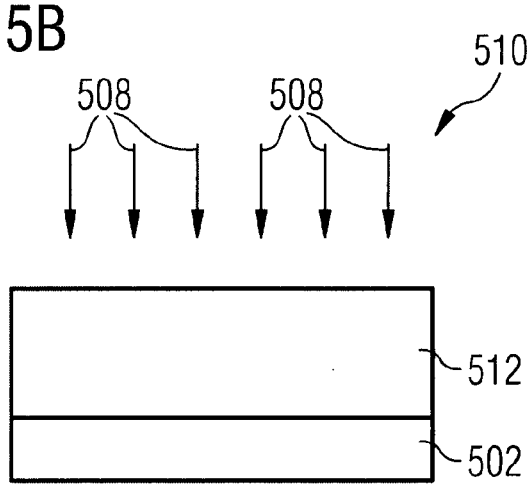
Figure 5C:
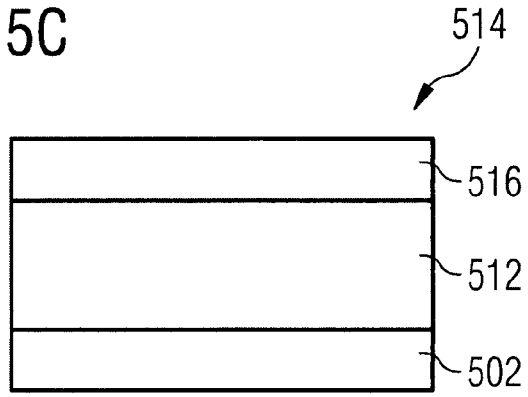

In another embodiment of 304, as shown in FIG. 5A to FIG. 5C, forming the metal doped chalcogenide layer is carried out by co-depositing chalcogenide material and metal using light irradiation at least partially during the co-deposition process. As shown in structure 500 in FIG. 5A, metal particles 504 and chalcogenide particles 506 are co-sputtered on or above the upper surface of the previously-formed bottom electrode 502. In this embodiment of the invention, the light source 210 is controlled in such a way that the light is illuminated on the upper surface of the bottom electrode 502 during the co-sputtering of the metal and the chalcogenide.

In one particular embodiment of the invention, the metal used for forming the metal doped chalcogenide layer 512 is a metal of a group of metals consisting of silver, copper, and an alloy of silver with another metal. The result of the co-sputter process is shown in structure 510 in FIG. 5B including the metal doped chalcogenide layer 512.

In a particular embodiment of the invention, process parameters are as follows:

gases: Argon (Ar), Helium (He), Neon (Ne), Argon-Helium (Ar—He), Argon-Neon (Ar—Ne), Krypton (Kr), Argon-Krypton (Ar—Kr), gas flow: 10 Standard Cubic Centimeters per Minute (sccm)-50 Standard Cubic Centimeters per Minute (sccm), pressure: 0.05 milliTorr (mT)-10 milliTorr (mT), process power: 30 Watts (W)-500 Watts (W), wavelength of the light: 200 nanometers (nm)-400 nanometers (nm), light intensity: 1 milliwatts per square centimeter (mW/cm$^2$)-100 milliwatts per square centimeter (mW/cm$^2$), layer thicknesses: 30 nanometers (nm)-80 nanometers (nm).

In one embodiment of the invention, the deposition process of the metal particles 504 selects a relatively constant deposition rate for the metal. In another embodiment of the invention, the deposition process of the metal particles 504 selects a variable deposition rate for the metal that can be used to vary the metal concentration in the resulting metal-doped chalcogenide layer. The deposition rate for the metal particles 504 is related to the sputter power applied to the metal target allowing this way the sputter power to control the deposition rate. It will be understood by those skilled in the art that the deposition rate versus sputter power varies according to the configuration of the deposition system and the material that is sputtered.

In one embodiment of the invention, the deposition rate for the chalcogenide particles 506 is relatively constant. In another embodiment of the invention, the deposition rate for the chalcogenide particles 506 can vary and can be used to vary the concentration of the metal in the metal-doped chalcogenide layer. The deposition rate for the chalcogenide is related to the sputter power applied to the chalcogenide target allowing the selection of the appropriate deposition rate by selection of the appropriate sputter power.

In one embodiment of the invention, the relative deposition rates between the metal and the chalcogenide determine the concentration of the metal in the metal-doped chalcogenide. In one embodiment of the invention and for the purposes of illustration only, the sputter powers for Silver (Ag) and Germanium diSulfide (GeS2) are 50 and 300 Watts (W), respectively, producing a doped film with about 30% Silver (Ag) by atomic mass.

In one embodiment of the invention, adding an external or in-situ ultraviolet radiation source to a deposition tool will achieve an improved control on the amount of ultraviolet radiation needed to diffuse a metal material into a chalcogenide material. One effect is the fact that the ultraviolet radiation is done during the deposition of the metal material on a chalcogenide layer or during co-sputtering of a chalcogenide material with a metal material. In one embodiment of the invention, the ultraviolet radiation and the deposition of the metal material on a chalcogenide layer or co-sputtering of a chalcogenide material with a metal material are done simultaneously. This combines simultaneously the creation of electron-holes in a chalcogenide material when it is already deposited or during co-sputtering of chalcogenide-metal materials with better mobility of the metal particles (since having a kinetic energy larger than zero when attaining the chalcogenide material, the metal particles will have a better diffusion) during the deposition onto the chalcogenide material, which leads to a much enhanced and uniform diffusion of the metal particles into the chalcogenide material.

Referring now back to FIG. 3, at 306, a second electrode (also referred to as a top electrode in the following) is formed. In a particular embodiment of the invention, the top electrode (such as top electrode 416 in memory cell 414 in FIG. 4C, or top electrode 516 in memory cell 514 in FIG. 5C) is deposited on or above the upper surface of the metal doped chalcogenide layer (e.g., 412, 512). In one particular embodiment of the invention, the second electrode includes silver (Ag). In an alternative embodiment of the invention, any other suitable metal may be used for the second electrode. In one embodiment of the invention, the second electrode has a thickness in the range of about 5 nanometers (nm) to about 50 nanometers (nm). In one embodiment of the invention, the second electrode has a thickness in the range of about 5 nanometers (nm) to about 30 nanometers (nm). In one embodiment of the invention, the metal of the second electrode may be a metal selected of a group of metals consisting of Silver (Ag), Silver-Copper (Ag—Cu), Silver-Tantalum (Ag—Ta), Silver-Aluminum (Ag—Al), Silver-Molybdenum (Ag—Mo), Silver-Ruthenium (Ag—Ru), Silver-Tantalum Nitride (Ag—TaN), Silver-Sulfur ($Ag_xSi_{1-x}$), Silver-Titanium (Ag—Ti), Silver-Platinum-Palladium-Copper (Ag—Pt—Pd—Cu).

FIG. 6 shows a flow diagram 600 illustrating a method of manufacturing a memory cell in accordance with another exemplary embodiment of the invention.

Processes 302 and 304 in accordance with the embodiment shown in FIG. 6 are identical with the processes 302 and 304 in accordance with the embodiment shown in FIG. 3 and will, therefore, not be described again.

After the formation of the metal doped chalcogenide layer (e.g., 412, 512), at 602, a metal layer is formed on or above the upper surface of the metal doped chalcogenide layer (e.g., 412, 512). In one embodiment of the invention, one metal material of the group of the metals described above to be used for the doping of the chalcogenide may be used, e.g., the same material.

Then, the deposition of the metal layer is stopped at 604 and then, at 606, another photo-dissolution process is carried out by irradiating the metal layer with light, e.g., with ultraviolet light, thereby causing an additional diffusion of metal particles of the metal layer into the metal doped chalcogenide layer (e.g., 412, 512).

After having carried out the photo-disolution process, it is determined at 608, whether another metal layer is to be deposited on or above the metal layer (in case not all of the metal has been diffused into the metal doped chalcogenide layer (e.g., 412, 512)) or on or above the metal doped chalcogenide layer (e.g., 412, 512) (in case that all of the metal has been diffused into the metal doped chalcogenide layer (e.g., 412, 512)).

If another metal layer should be deposited ("Yes" in 608), the process continues at 602.

If no other metal layer should be deposited ("No" in 608), the process continues at 610, in which the top electrode is formed, e.g., in a similar manner as described above in process 306.

While several embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are, therefore, intended to be embraced.

What is claimed is:

1. A method of manufacturing a semiconductor device, the method comprising:
   forming a chalcogenide layer;
   depositing metal using a metal deposition process; and
   doping the chalcogenide layer with the metal using a light irradiation process during the metal deposition process thereby forming a metal doped chalcogenide layer, wherein the light irradiation process is configured to be independently controlled from the metal deposition process for depositing the metal.

2. The method of claim 1, further comprising forming a bottom electrode, wherein the metal doped chalcogenide layer is formed on or above the bottom electrode.

3. The method of claim 1, further comprising forming a top electrode on or above the metal doped chalcogenide layer.

4. The method of claim 1, wherein the chalcogenide layer is doped with a metal selected from the group of metals consisting of silver (Ag), copper (Cu), and an alloy of silver with at least another metal.

5. The method of claim 1, wherein the chalcogenide layer comprises a material selected from the group of materials consisting of sulfur, selenium, germanium and tellurium.

6. The method of claim 1, wherein the chalcogenide layer comprises a material selected from the group of materials consisting of germanium-sulfide, germanium-selenide, tungsten oxide, copper sulfide, and silicon-germanium-sulfide.

7. The method of claim 1, wherein the light irradiation process is carried out using light having a wavelength of between about 380 nm to about 400 nm.

8. The method of claim 1, wherein the light irradiation process is carried out using light having a wavelength of about 200 nm.

9. The method of claim 1, wherein the light irradiation process is carried out using ultraviolet light.

10. The method of claim 1, wherein forming the metal doped chalcogenide comprises one process in a process of forming a conductive bridging random access memory cell.

11. The method of claim 1, wherein forming the metal doped chalcogenide comprises one process in a process of forming a phase change random access memory cell.

12. The method of claim 1, further comprising varying at least one of timing, intensity, and wavelength of a light for the light irradiation process without changing the metal deposition process for depositing the metal.

13. A method of manufacturing a memory cell, the method comprising:
forming a bottom electrode;
forming a metal doped chalcogenide layer on or above the bottom electrode, wherein forming the metal doped chalcogenide layer comprises
forming a chalcogenide layer;
depositing metal using a metal deposition process; and
doping the chalcogenide layer with metal using a light irradiation process during the metal deposition process, wherein the light irradiation process is configured to be independently controlled from the metal deposition process for depositing the metal; and
forming a top electrode on or above the metal doped chalcogenide layer.

14. The method of claim 13, wherein the metal is selected from the group of metals consisting of silver, copper, and an alloy of silver with another metal.

15. The method of claim 13, wherein the chalcogenide layer is formed from a material selected from the group of materials consisting of Sulfur (S), Selenium (Se), Germanium (Ge) and Tellurium (Te).

16. The method of claim 13, wherein the light irradiation process is carried out using light having a wavelength of about 400 nm.

17. The method of claim 13, wherein forming the metal doped chalcogenide layer comprises co-depositing a chalcogenide material and the metal using light irradiation process at least partially during the co-depositing.

18. The method of claim 13, further comprising varying at least one of timing, intensity, and wavelength of a light for the light irradiation process without changing the metal deposition process for depositing the metal.

19. A method of manufacturing a memory cell, comprising:
forming a bottom electrode;
forming a metal doped chalcogenide layer on or above the bottom electrode wherein forming the metal doped chalcogenide layer comprises
forming a chalcogenide layer;
depositing metal using a metal deposition process; and
forming a metal doped chalcogenide layer by doping the chalcogenide layer with metal using ultraviolet light during the metal deposition process, wherein properties of the ultraviolet light are selected independently from the metal deposition process for depositing the metal; and
forming a top electrode on or above the metal doped chalcogenide layer.

20. The method of claim 19, wherein the chalcogenide layer is doped with a metal selected from the group of metals consisting of silver (Ag), copper (Cu), and an alloy of silver with at least another metal.

21. The method of claim 19, wherein the chalcogenide layer comprises a material selected from the group of materials consisting of sulfur, selenium, germanium and tellurium.

22. The method of claim 19, wherein the properties of the ultraviolet light comprise intensity and timing.

23. A method of manufacturing a semiconductor device, the method comprising:
forming a metal doped chalcogenide layer by co-depositing a chalcogenide material configured to form a chalcogenide layer and the metal configured to dope the chalcogenide layer, wherein the co-depositing is performed in combination with a light irradiation process.

24. The method of claim 23, further comprising forming a bottom electrode, wherein the metal doped chalcogenide layer is formed on or above the bottom electrode.

25. The method of claim 23, further comprising forming a top electrode on or above the metal doped chalcogenide layer.

26. The method of claim 23, wherein the metal is selected from the group of metals consisting of silver (Ag), copper (Cu), and an alloy of silver with at least another metal.

27. The method of claim 23, wherein the chalcogenide material comprises a material selected from the group of materials consisting of sulfur, selenium, germanium and tellurium.

28. The method of claim 23, wherein the chalcogenide material comprises a material selected from the group of materials consisting of germanium-sulfide, germanium-selenide, tungsten oxide, copper sulfide, and silicon-germanium-sulfide.

29. The method of claim 23, wherein the light irradiation process is carried out using light having a wavelength of about 380 nm to about 400 nm.

30. The method of claim 23, wherein the light irradiation process is carried out using ultraviolet light.

31. The method of claim 23, wherein the co-depositing comprises a co-sputtering process.

32. The method of claim 23, wherein forming the metal doped chalcogenide layer is one process in a process of forming a conductive bridging random access memory cell.

33. The method of claim 23, wherein forming the metal doped chalcogenide layer is one process in a process of forming a phase change random access memory cell.

34. The method of claim 23, wherein the light irradiation process is configured to be independently controlled from the co-depositing.

35. The method of claim 34, further comprising varying at least one of timing, intensity, and wavelength of a light for the light irradiation process without changing gas ratios during the co-depositing.

36. The method of claim 23, wherein the chalcogenide material comprises germanium disulfide, and wherein the metal comprises silver.

37. A method of manufacturing a semiconductor device, the method comprising:
(a) forming a metal doped chalcogenide layer comprising forming a chalcogenide layer;
depositing metal using a metal deposition process; and
doping the chalcogenide layer with metal using a light irradiation process during a metal deposition process, wherein the light irradiation process is configured to be independently controlled from the metal deposition process for depositing the metal;

(b) forming a layer of metal above the metal doped chalcogenide layer; and (c) irradiating the layer of metal.

38. The method of claim 37, the method further comprising repeating step (b) and (c).

39. The method of claim 37, further comprising forming a bottom electrode, wherein the metal doped chalcogenide layer is formed on or above the bottom electrode.

40. The method of claim 37, the method further comprising forming a top electrode on top of the metal doped chalcogenide layer.

41. The method of claim 37, wherein irradiating comprises irradiating with ultraviolet light.

42. The method of claim 37, wherein the metal is selected from the group of metals consisting of silver (Ag), copper (Cu), and an alloy of silver with at least another metal.

43. The method of claim 37, wherein the chalcogenide layer comprises a material selected from the group of materials consisting of sulfur, selenium, germanium and tellurium.

44. The method of claim 37, further comprising varying at least one of timing, intensity, and wavelength of a light for the light irradiation process without changing the metal deposition process for depositing the metal.

* * * * *